(12) United States Patent
Jiang et al.

(10) Patent No.: US 6,649,514 B1
(45) Date of Patent: Nov. 18, 2003

(54) EEPROM DEVICE HAVING IMPROVED DATA RETENTION AND PROCESS FOR FABRICATING THE DEVICE

(75) Inventors: Chun Jiang, San Jose, CA (US); Sunil D. Mehta, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 10/236,718

(22) Filed: Sep. 6, 2002

(51) Int. Cl.[7] ................... H01L 21/4763; H01L 21/318
(52) U.S. Cl. ................... 438/629; 438/697; 438/706; 438/773; 438/728
(58) Field of Search ............... 438/261, 235, 438/236, 243, 247, 248, 706, 728, 723, 697, 699, 784, 788, 629; 257/314, 315, 316

(56) References Cited

U.S. PATENT DOCUMENTS

| | | | | |
|---|---|---|---|---|
| 5,298,436 A | * | 3/1994 | Radosevich et al. | 438/396 |
| 5,332,914 A | * | 7/1994 | Hazani | 365/185.14 |
| 5,598,028 A | * | 1/1997 | Losavio et al. | 257/644 |
| 5,717,237 A | * | 2/1998 | Chi | 257/315 |
| 5,726,087 A | * | 3/1998 | Tseng et al. | 438/261 |
| 5,895,259 A | * | 4/1999 | Carter et al. | 438/563 |
| 5,994,231 A | * | 11/1999 | Sonego et al. | 438/706 |
| 6,136,652 A | * | 10/2000 | Hazani | 438/260 |
| 6,162,247 A | * | 12/2000 | Weadock et al. | 623/1.47 |
| 6,362,508 B1 | * | 3/2002 | Rasovsky et al. | 257/369 |
| 6,437,424 B1 | * | 8/2002 | Noma et al. | 257/639 |
| 6,542,412 B2 | * | 4/2003 | Ogura et al. | 365/185.33 |
| 6,551,867 B1 | * | 4/2003 | Ozeki et al. | 438/159 |
| 6,552,587 B2 | * | 4/2003 | Kim et al. | 327/158 |
| 6,576,546 B2 | * | 6/2003 | Gilbert et al. | 438/629 |

* cited by examiner

*Primary Examiner*—Michael S. Lebentritt
(74) *Attorney, Agent, or Firm*—Brinks Hofer Gilson & Lione

(57) ABSTRACT

An EEPROM device having improved data retention and process for fabricating the device includes a two-step deposition process for the fabrication of an ILD layer overlying the high voltage elements of an EEPROM memory cell. The ILD layer is fabricated by first depositing an insulating layer on a high voltage device layer and thermally treating insulating layer. A second insulating layer is then deposited to overlie the first insulating layer. An EEPROM device in accordance with the invention includes a floating-gate transistor having a specified threshold voltage. A thermally-treated, boron-doped oxide layer overlies the floating-gate transistor and a second oxide layer overlies the thermally-treated, boron-doped oxide layer. The memory device exhibits data retention characteristics, such that upon subjecting the device to a baked temperature of at least about 250° C. for at least about 360 hours, the threshold voltage of the floating-gate transistor shifts by no more than about 100 mV.

16 Claims, 3 Drawing Sheets

EEPROM DEVICE HAVING IMPROVED DATA RETENTION AND PROCESS FOR FABRICATING THE DEVICE

TECHNICAL FIELD

The present invention relates, generally, to non-volatile memory devices and fabrication processes and, more particularly, to inter-level-dielectric (ILD) structures for EEPROM memory devices and to methods of fabrication.

BACKGROUND

Non-volatile memory devices are both electrically erasable and programmable. Such devices retain data even after the power to the device is terminated. One particular type of non-volatile memory device is the EEPROM device. In a flash EEPROM device, programming and erasing is accomplished by transferring electrons to and from a floating-gate gate electrode through a thin dielectric layer, known as a tunnel oxide layer, located between the floating-gate electrode and the underlying substrate. Typically, the electron transfer is carried out either by hot electron injection, or by Fowler-Nordheim tunneling. In either electron transfer mechanism, a voltage is coupled to the floating-gate electrode by a control-gate electrode, which can be a doped region in the substrate. The control-gate electrode is capacitively coupled to the floating-gate electrode, such that a voltage applied to the control-gate electrode is coupled to the floating-gate electrode.

EEPROM cells are extensively used in programmable logic devices (PLDs). EEPROM cells used in PLDs can have a two-transistor design or a three-transistor design. A three transistor EEPROM cell, for example, includes a write transistor, a read transistor, and a sense transistor. In a two-transistor device, the functions of read and sense transistors are combined into a single transistor. To program PLD EEPROMs, a high voltage $V_{pp}+$ is applied to the gate electrode of the write transistor and a relatively low $V_{pp}$ is applied to the drain (bit line contact) of the write transistor. The voltage applied to the write transistor gate electrode turns the write transistor on allowing the voltage applied to the bit line to be transferred to the source of the write transistor. Electrons on the floating-gate electrode are drawn from the floating-gate electrode to the source of the write transistor, leaving the floating-gate electrode at a high positive potential. The application of such high voltage levels is a write condition that results in a net positive charge being stored in the EEPROM cell.

To erase the EEPROM cell, a voltage $V_{cc}$ is applied to the gate of the write transistor and ground potential is applied to the bit line and a high voltage $V_{pp}+$ is applied to the control-gate electrode. Under this bias condition, the high voltage applied to control-gate electrode is coupled to the floating-gate electrode and the EEPROM cell is erased by the transfer of electrons from the substrate to the floating-gate electrode.

To effectively store information, electrical charge must remain on the floating-gate electrode after a programming operation. EEPROM devices are typically constructed as memory cells packed closely together in a memory array. As the EEPROM memory cell and neighboring cells are continually programmed and erased, the active cell is subjected to high voltage levels, for example $V_{pp}+$ is typically at least about 12 volts. Neighboring cells also experience a high electric field during the program and erase operations of a selected cell.

During high voltage operation, there is a tendency for the charge on the floating-gate to bleed off, or leak, as a result of exposure to high electric fields. When charge leaks from the floating-gate, the memory cell will lose its stored data. Good data retention is a key reliability characteristic of a non-volatile memory device. As memory devices are scaled to smaller and smaller dimensions, good data retention becomes more difficult achieve. This is due, in part, to the high packing density of the memory cells and to the relatively small size of the floating-gate charge storage layer. Better data retention can be obtained in advanced memory devices by improving the overlying electrical insulation layers that reside between the charge storage elements and the electrical interconnect layers. Accordingly, a need exists for an EEPROM device and fabrication process to produce an EEPROM device having improved data retention characteristics.

SUMMARY

An EEPROM memory device and fabrication process is provided for an EEPROM memory device having improved data retention characteristics. In one aspect of the invention, an inter-level-dielectric layer is provided that is fabricated using a two-step deposition process. An annealing process is carried out between the two deposition steps to improve the electrical insulation characteristics of the inter-level-dielectric (ILD) layer. Additionally, the ILD layer is doped to improve its step coverage and annealing characteristics. In a further aspect of the invention, the first deposited layer is etched back prior to depositing the second layer. In a preferred embodiment of the invention, the first deposited layer is doped with boron and phosphorous, and the second deposited layer is doped with phosphorous. An EEPROM device fabricated in accordance with the invention includes a floating-gate transistor having stable threshold voltage values, even when subjected to high temperature baking over a prolonged period of time. EEPROM devices fabricated in accordance with the invention also exhibit high endurance and show little high voltage leakage.

In one aspect, the invention includes providing a substrate having a high voltage device layer thereon. A first oxide layer is deposited on the device layer and the first oxide layer is thermally treated. A second oxide layer is then deposited to overlie the first oxide layer after thermally treating the first oxide layer. The first oxide layer is preferably deposited using an alkyl silicon source gas, such as tetraethylorsilane and the like.

In another aspect of the invention, an EEPROM memory device is provided having a floating-gate transistor that is fabricated to have a specified threshold voltage. A dielectric liner overlies the floating-gate transistor. An annealed, boron-doped oxide layer overlies the dielectric liner. A second oxide layer overlies the annealed, boron-doped oxide layer.

It will be appreciated that for simplicity and clarity of illustration, elements shown in the Figures have not necessarily been drawn to scale. For example, the dimensions of some of the elements are exaggerated relative to each other

DETAILED DESCRIPTION

Figure 1:
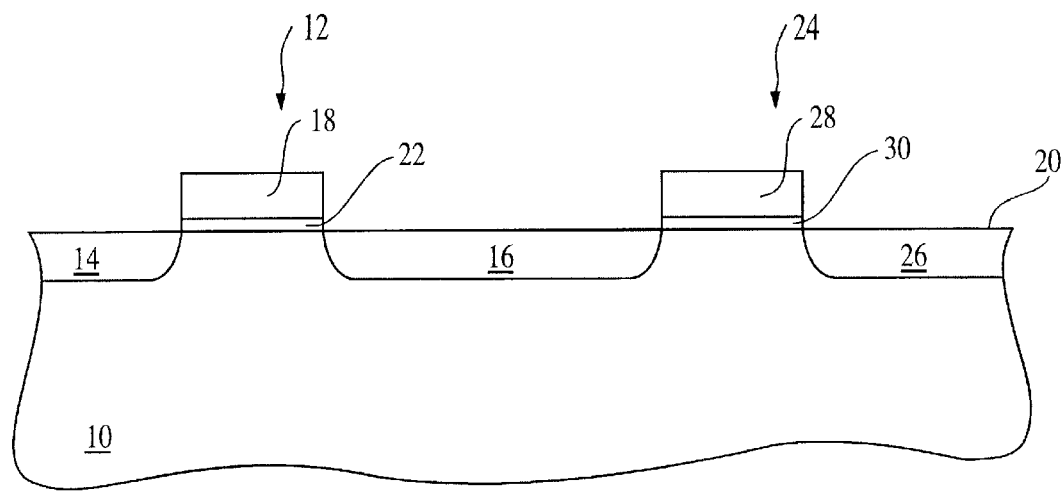
FIGS. 1–5 illustrate, in cross-section, processing steps in accordance with the invention.

Shown in FIG. 1, in cross-section, is a semiconductor substrate 10 having already undergone several processing steps in accordance with the invention. To illustrate the invention, a fabrication sequence will be described for the fabrication of a write transistor and a floating-gate transistor in a two-transistor EEPROM memory device. Those skilled in the art will, however, appreciate that the inventive elements of the present invention can be applied to other memory devices, such as three-transistor EEPROM memory devices, and other non-volatile memory devices that employ high voltage operation. Accordingly, principles of the present invention can be applied to many different devices beyond those illustrative embodiments described herein.

As illustrated in FIG. 1, a write transistor 12 includes a drain region 14 and a source region 16 in semiconductor substrate 10. A gate electrode 18 overlies a principal surface 20 of semiconductor substrate 10 and is separated therefrom by a gate dielectric layer 22. A floating-gate transistor 24 resides adjacent to write transistor 12. Floating-gate transistor 24 includes a source region 26 and a drain region that it shares with source region 16 of write transistor 12. Floating-gate transistor 24 further includes a floating-gate electrode 28 that is separated from principal surface 20 by a tunnel dielectric layer 30.

Those skilled in the art will recognize write transistor 12 and floating-gate transistor 24 as functional elements of a two-transistor EEPROM memory cell. In operation, electrical potentials applied to drain region 14 and source region 26 cause electrical charge to be transferred to and from floating-gate electrode 28. In accordance with the invention, an ILD layer is provided that effectively, electrically insulates floating-gate electrode 28, such that charge stored on floating-gate electrode 28 is retained for prolonged periods of time.

Figure 2:
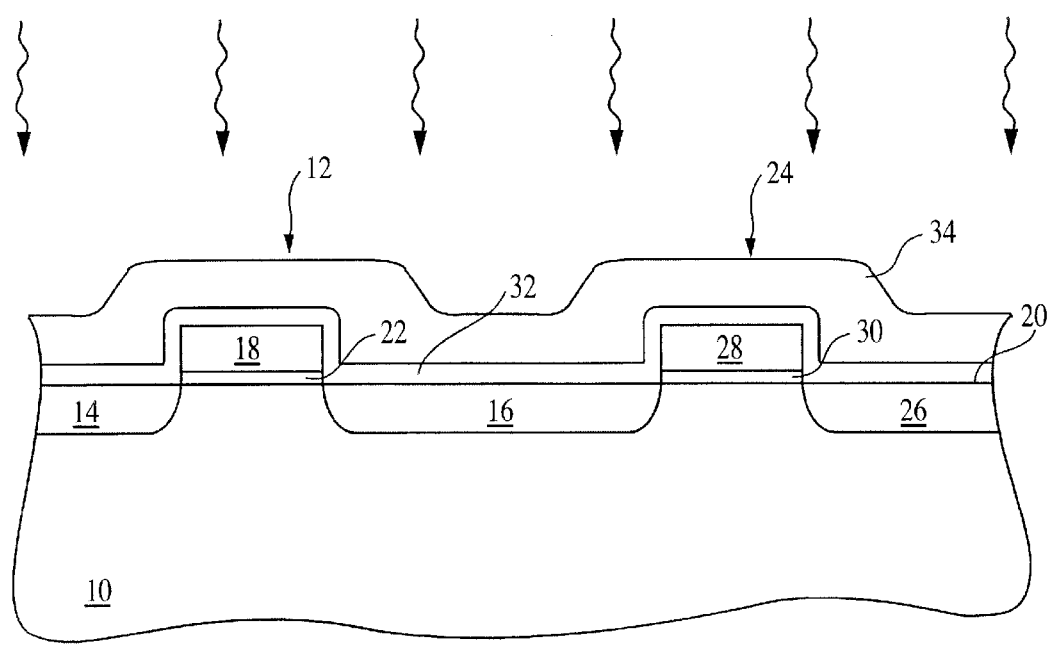

In accordance with one embodiment of the invention, as illustrated in FIG. 2, a dielectric liner 32 is conformably deposited to overlie principal surface 20 and gate electrodes 18 and 28. Then, a first insulating layer 34 is deposited to overlie dielectric liner 32. Preferably, first insulating layer of 34 is a silicon dioxide layer that is deposited by chemical-vapor-deposition (CVD) using an alkyl silicon source gas. In a preferred embodiment, the alky silicon source gas is tetraethylorthosilane (TEOS). Where first insulating layer 34 is a silicon dioxide material, dielectric liner 32 is preferably an un-doped silicon dioxide layer. As used herein, the term "silicon dioxide" is intended to represent all stoichiometric combinations of silicon with oxygen, including silicon oxide, silicates, and the like. Preferably, first insulating layer 34 is doped with either phosphorous or boron, and most preferably, with boron and phosphorous. In accordance with the invention, first insulating layer 34 has a boron concentration of about 3 wt. % to about 5 wt. % and a phosphorous concentration of about 4 wt. % to about 7 wt. %. The CVD deposition processes is carried out to form a silicon dioxide layer preferably having a thickness of about 5000 angstroms to about 10,000 angstroms and, more preferably, to a thickness of about 7500 angstroms.

After depositing first insulating layer 34, a thermal treatment process is carried out to annealing first insulating layer 34. The annealing process reduces the leakage current from floating-gate transistor 24. During the annealing process, first insulating layer 34 is softened, such that it flows and uniformly coats write transistor 12 and floating-gate transistor 24. Preferably, the annealing process is carried out at a temperature of about 800° C. to about 900° C. and, more preferably, at a temperature of about 850° C. In a most preferred process embodiment, first insulating layer 34 is annealed in a rapid-thermal-processing (RTP) apparatus. The RTP annealing process is preferably carried out for about 10 seconds to about 30 seconds and, more preferably, for about 20 seconds. As result of the annealing process, first insulating layer 34 uniformly coats write transistor 12 and floating-gate transistor 24 with a layer of electrically insulating material. In addition to mechanically flowing first insulation layer 34, the annealing process also denitrifies first insulating layer 34 to improve its electrical insulation characteristics.

Figure 3:
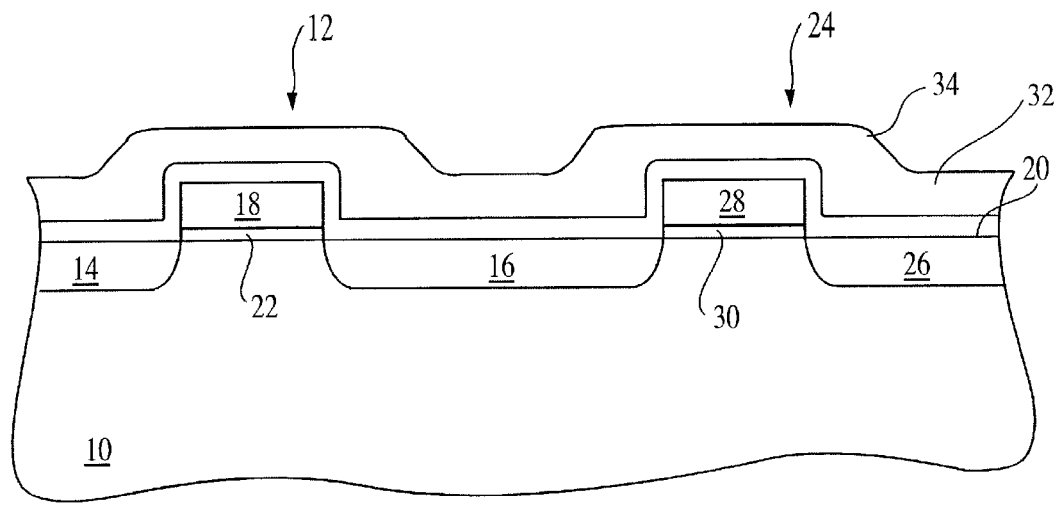

After annealing first insulation layer 34, an etch back process is carried out to thin first insulating layer 34, as illustrated in FIG. 3. Preferably, first insulating layer 34 is isotropically etched to remove a surface portion of first insulating layer 34. In a preferred embodiment, about one third of the initial deposited thickness is removed by the isotropic etching process. The isotropic etching process is preferably a dry isotropic etching process carried out using chemical species that are reactive with the particular material composition of first insulating layer 34. For example, where first insulating layer 34 is a silicon dioxide material, fluorinated etching gases are employed in a dry isotropic etching process. Where first insulating layer 34 is deposited to the most preferred thickness of about 7500 angstroms, the isotropic etching process is carried out, such that about 5000 angstroms of first insulating layer 34 remain upon completion of the etching process.

Figure 4:
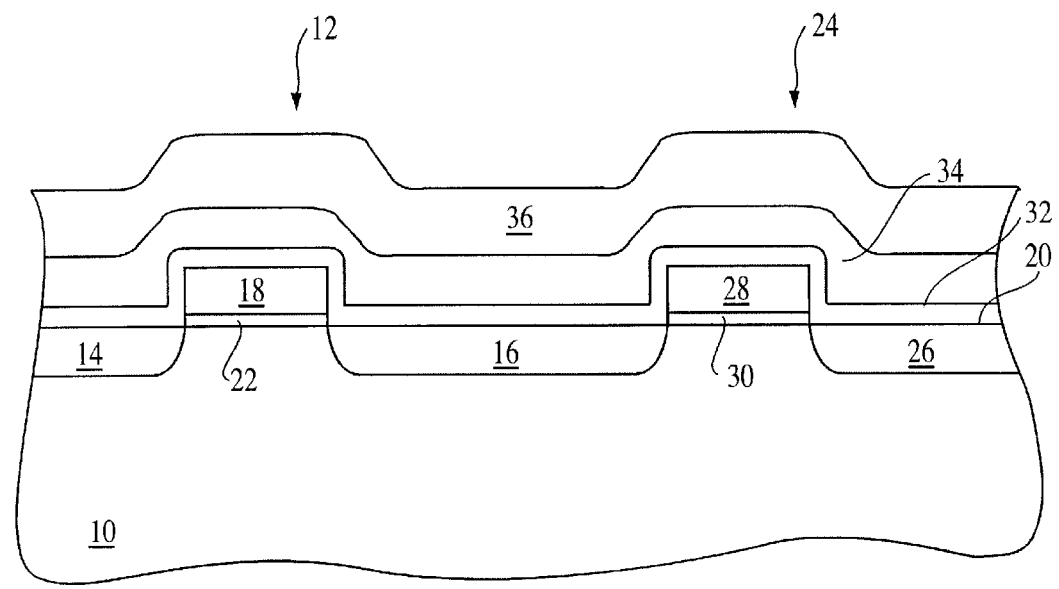

Once first insulating layer 34 is processed, as illustrated in FIG. 4, a second insulating layer 36 is deposited to overlie first insulating layer 34. Second insulating layer 36 is preferably a doped silicate glass layer having a thickness of about 10,000 angstroms to about 20,000 angstroms and, more preferably, a thickness of about 14,000 angstroms. In a preferred embodiment of the invention, second insulating layer 36 is a phosphorous doped silicate glass layer deposited by a CVD process. The process is carried out such that second insulating layer 36 completely coats first insulating layer 34 and forms a thick electrical insulation layer overlying write transistor 12 and floating-gate transistor 24.

Figure 5:
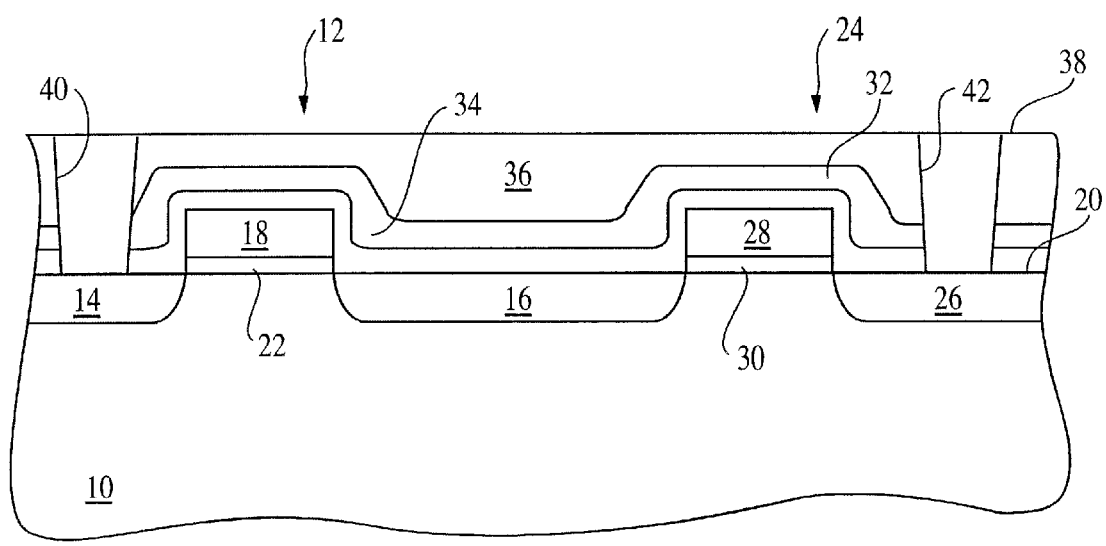

Referring to FIG. 5, the inventive fabrication process continues with the planarization of second insulating layer 36 to form a planar surface 38. Preferably, second insulating layer 36 is planarized using a chemical-mechanical-polishing (CMP) process. The CMP process forms planar surface 38, such that an electrical interconnect layer can be reliably formed over write transistor 12 and floating-gate transistor 24. In accordance with the invention, improved planarization is obtained by the CMP process as compared to processes of the prior art. The sequential deposition process incorporating an intermediate anneal improves the surface coverage of the ILD layer and enables the easy formation of a planar surface.

Upon completion of the planarization process, contact openings 40 and 42 are formed through second insulating layer 36, first insulating layer 34, and dielectric liner 32 to expose portions of principal surface 20 at drain region 14 and source region 26, respectively. Contact openings 40 and 42 permit bit line connections to be made to write transistor 12 and floating-gate transistor 24.

Floating-gate transistors fabricated in accordance with the invention exhibit improved data retention compared with similar transistors fabricated in accordance with the prior art. The threshold voltage ($V_{te}$) of a floating-gate transistor can be used to gauge the data retention characteristics of an EPROM memory cell fabricated in accordance with the invention. Because electrical charge is stored on the gate electrode of the floating-gate transistor, changes in the amount of charge stored on the floating-gate electrode will be reflected by a shift in the threshold voltage of the floating-gate transistor. The long-term data retention characteristics of an EPROM memory cell can, therefore, be determined by exposing floating-gate transistors to a baking process at high temperature over a number of hours and, measuring the threshold voltage shift of the floating-gate transistor as a consequence of the baking process.

Figure 6:
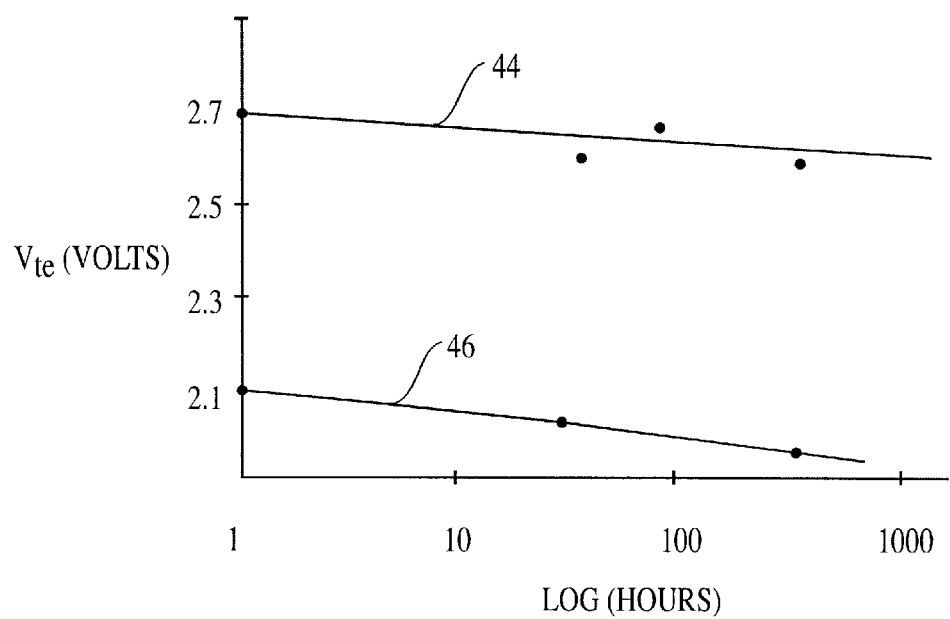
FIG. 6 is a comparison plot of threshold voltage versus bake time for floating gate transistors fabricated in accordance with the invention and in accordance with the prior art.

To illustrate the improved data retention performance of memory cells fabricated in accordance with the invention, floating-gate transistors were subjected to a baking process of about 250° C. for about 360 hours. The threshold voltages of the transistors were periodically measured at various times during the baking process. FIG. 6 illustrates a plot that compares the threshold voltage characteristics of floating-gate transistors fabricated in accordance with the invention and those fabricated in accordance with the prior art.

In FIG. 6, line 44 represents a best fitting straight line through the data collected for floating-gate transistors fabricated in accordance with the invention. For comparison, line 46 represents a best fitting straight line through the data collected for transistors fabricated in accordance with the prior art. The prior art transistors included a 3,000 angstrom phosphorous doped silicate glass layer and a 500 angstrom undoped silicon dioxide layer overlying the transistors. The prior art transistors also included a 10,200 angstrom silicon dioxide layer formed by tetraethylorthosilane (TEOS) overlying the phosphorous doped silicate glass layer. Further, in contrast to the transistors fabricated in accordance with the invention, the fabrication process for the prior art transistors did not include an annealing step during the fabrication of the ILD layer overlying the floating-gate transistor.

As further illustrated in FIG. 6, the slope of line 44 is less than the corresponding slope of line 46. This indicates that transistors fabricated in accordance with the invention show improved threshold voltage stability over a prolonged period of time. The improved threshold voltage stability translates directly into improved data retention of EEPROM memory cells fabricated in accordance with the invention. Accordingly, an EEPOM memory device fabricated and arranged in accordance with the invention exhibits data retention characteristics, such that upon subjecting the memory device to a bake temperature of at least about 250° C. for at least about 360 hours, the threshold voltage of floating-gate transistors in the device shift by no more than about 100 mV.

Thus it is apparent that there has been described, in accordance with the invention, an EEPROM device having improved data retention and a method for fabricating the device that fully provides the advantages set forth above. Although the invention has been described and illustrated with respect to illustrative embodiments thereof, it is not intended that the invention be limited to those illustrative embodiments. Those skilled in the art will recognize that variations and modifications can be made from the embodiments described above. For example, various thicknesses of the described insulation layers can be fabricated, depending upon the underlying transistor's dimensions and materials of composition. Accordingly, it is intended that all such variations and modifications be included within the scope of the appended claims and equivalents thereof.

What is claimed is:

1. A process for fabricating an EEPROM device comprising:

providing a substrate having a high voltage device layer thereon;

depositing a first insulating layer on the device layer;

thermally treating the first insulating layer removing a surface portion of the first insulating layer after thermally treating the first insulating layer; and depositing a second insulating layer overlying the first insulating layer after thermally treating the first insulating layer.

2. The process of claim 1, wherein thermally treating the first insulating layer comprises rapid thermal annealing.

3. The process of claim 2, wherein rapid thermal annealing comprises annealing at a temperature of about 800° C. to about 900° C.

4. The process of claim 1, wherein depositing a first insulating layer comprises depositing a boron-doped oxide layer.

5. The process of claim 4, wherein depositing a boron-doped oxide layer comprises depositing an oxide layer using an alkyl silicon source gas.

6. The process of claim 4, wherein depositing an oxide layer using an alkyl silicon source gas comprises using tetraethylorthosilane gas.

7. The process of claim 1 further comprising plannarizing the second insulating layer.

8. The process of claim 1, wherein depositing a second insulating layer comprises depositing a phosphorus doped oxide layer.

9. A process for fabricating a semiconductor device comprising:

forming a high voltage transistor;

depositing a doped oxide layer on the high voltage transistor;

thermally treating the doped oxide layer removing a surface portion of the doped oxide layer after thermally treating the first doped oxide layer; and depositing a second oxide layer overlying the first oxide layer after thermally treating the first oxide layer.

10. The process of claim 9, wherein forming a high voltage transistor comprises forming a high voltage transistor in an EEPROM memory cell.

11. The process of claim 10, wherein forming a high voltage transistor in an EEPROM memory cell comprises forming a write transistor.

12. The process of claim 9, wherein thermally treating the doped oxide layer comprises rapid thermal annealing.

13. The process of claim 12, wherein rapid thermal annealing comprises annealing at a temperature of about 800° C. to about 900° C.

14. The process of claim 9, wherein depositing a doped oxide layer comprises depositing a boron-doped oxide layer.

15. The process of claim 14, wherein depositing a boron-doped oxide layer comprises depositing an oxide layer using an alkyl silicon source gas.

16. The process of claim 15, wherein depositing an oxide layer using an alkyl silicon source gas comprises using tetraethylorthosilane gas.

* * * * *

UNITED STATES PATENT AND TRADEMARK OFFICE
CERTIFICATE OF CORRECTION

PATENT NO.     : 6,649,514 B1
DATED          : November 18, 2003
INVENTOR(S)    : Jiang et al.

It is certified that error appears in the above-identified patent and that said Letters Patent is hereby corrected as shown below:

<u>Column 6,</u>
Lines 35-45 should read,
-- 9. A process for fabricating a semiconductor device comprising:
forming a high voltage transistor;
depositing a doped oxide layer on the high voltage transistor; thermally treating the doped oxide layer;
removing a surface portion of the doped oxide layer after thermally treating the doped oxide layer; and
depositing a second oxide layer overlaying the doped oxide layer after thermally treating the doped oxide layer. --

Signed and Sealed this

Eighth Day of June, 2004

JON W. DUDAS
*Acting Director of the United States Patent and Trademark Office*